United States Patent
Pape

(10) Patent No.: US 12,074,049 B2
(45) Date of Patent: Aug. 27, 2024

(54) PERMANENT SECONDARY EROSION CONTAINMENT FOR ELECTROSTATIC CHUCK BONDS

(71) Applicant: LAM RESEARCH CORPORATION, Fremont, CA (US)

(72) Inventor: Eric A. Pape, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 1220 days.

(21) Appl. No.: 16/452,462

(22) Filed: Jun. 25, 2019

(65) Prior Publication Data

US 2019/0311935 A1 Oct. 10, 2019

Related U.S. Application Data

(63) Continuation of application No. 15/157,959, filed on May 18, 2016, now Pat. No. 10,340,171.

(51) Int. Cl.
*H01L 21/683* (2006.01)
*C23C 16/44* (2006.01)
(Continued)

(52) U.S. Cl.
CPC ...... *H01L 21/6833* (2013.01); *C23C 16/4404* (2013.01); *C23C 16/4409* (2013.01);
(Continued)

(58) Field of Classification Search
CPC ............. H01L 21/6833; H01L 21/6831; H01L 21/68735; H01L 21/68757;
(Continued)

(56) References Cited

U.S. PATENT DOCUMENTS

| | | | |
|---|---|---|---|
| 3,752,956 A | 8/1973 | Cahill et al. | |
| 4,416,561 A | 11/1983 | Fischer | |

(Continued)

FOREIGN PATENT DOCUMENTS

| | | | |
|---|---|---|---|
| JP | 08293539 A | 11/1996 | |
| JP | 2000049143 A | 2/2000 | |

(Continued)

OTHER PUBLICATIONS

Translation of First Office Action dated Jun. 24, 2021 corresponding to Japanese Patent Application 2017-094326, 5 pages.

(Continued)

*Primary Examiner* — Charlee J. C. Bennett

(57) ABSTRACT

A substrate support for a substrate processing chamber includes a baseplate, a ceramic layer bonded to the baseplate, and a seal provided in an outer perimeter of an interface between the ceramic layer and the baseplate. The seal is arranged to seal the interface from the substrate processing chamber and includes an adhesive comprising a first material arranged in the outer perimeter of the interface between the ceramic layer and the baseplate and a ring arranged in the outer perimeter of the interface between the (Continued)

ceramic layer and the baseplate. The ring is removable and comprises a second material having a greater resistance to plasma erosion than the first material.

14 Claims, 3 Drawing Sheets

(51) Int. Cl.
  *C23C 16/455* (2006.01)
  *C23C 16/458* (2006.01)
  *H01J 37/32* (2006.01)
  *H01L 21/687* (2006.01)

(52) U.S. Cl.
  CPC .... *C23C 16/45544* (2013.01); *C23C 16/4583* (2013.01); *H01J 37/32082* (2013.01); *H01J 37/32477* (2013.01); *H01J 37/32513* (2013.01); *H01J 37/32715* (2013.01); *H01L 21/6831* (2013.01); *H01L 21/68735* (2013.01); *H01L 21/68757* (2013.01); *H01L 21/68785* (2013.01); *H01J 2237/334* (2013.01)

(58) Field of Classification Search
  CPC .......... H01L 21/68785; C23C 16/4404; C23C 16/4409; C23C 16/45544; C23C 16/4583; H01J 37/32082; H01J 37/32477; H01J 37/32715; H01J 2237/334
  USPC .......... 118/728, 715–733; 156/345.1–345.55
  See application file for complete search history.

(56) References Cited

U.S. PATENT DOCUMENTS

| | | |
|---|---|---|
| 5,059,770 A | 10/1991 | Mahawill |
| 5,074,456 A | 12/1991 | Degner et al. |
| 5,359,148 A * | 10/1994 | Okase ............... H01L 21/67115 285/364 |
| 5,376,213 A | 12/1994 | Ueda et al. |
| 5,447,570 A | 9/1995 | Schmitz et al. |
| 5,522,131 A | 6/1996 | Steger |
| 5,583,736 A | 12/1996 | Anderson et al. |
| 5,745,331 A | 4/1998 | Shamouilian et al. |
| 5,753,132 A | 5/1998 | Shamouilian et al. |
| 5,781,400 A | 7/1998 | Takahashi et al. |
| 5,886,863 A | 3/1999 | Nagasaki et al. |
| 5,928,528 A | 7/1999 | Kubota et al. |
| 5,944,902 A | 8/1999 | Redeker et al. |
| 5,968,379 A | 10/1999 | Zhao et al. |
| 5,968,587 A | 10/1999 | Frankel |
| 5,978,202 A | 11/1999 | Wadensweller et al. |
| 6,035,101 A | 3/2000 | Saloto et al. |
| 6,048,798 A | 4/2000 | Gadgil et al. |
| 6,073,577 A | 6/2000 | Lilleland et al. |
| 6,108,189 A | 8/2000 | Weldon et al. |
| 6,170,432 B1 | 1/2001 | Szapucki et al. |
| 6,189,483 B1 | 2/2001 | Ishikawa et al. |
| 6,194,322 B1 | 2/2001 | Lilleland et al. |
| 6,228,438 B1 | 5/2001 | Schmitt |
| 6,228,439 B1 | 5/2001 | Watanabe et al. |
| 6,306,247 B1 | 10/2001 | Lin |
| 6,310,755 B1 | 10/2001 | Kholodenko et al. |
| 6,357,759 B1 * | 3/2002 | Azuma ............... F16J 15/128 277/611 |
| 6,376,385 B2 | 4/2002 | Lilleland et al. |
| 6,395,363 B1 | 5/2002 | Ballance et al. |
| 6,452,775 B1 | 9/2002 | Nakajima |
| 6,462,928 B1 | 10/2002 | Shamouilian et al. |
| 6,475,336 B1 | 11/2002 | Hubacek |
| 6,490,146 B2 | 12/2002 | Wang et al. |
| 6,522,519 B1 | 2/2003 | Hirayanagi |
| 6,538,872 B1 | 3/2003 | Wang et al. |
| 6,625,003 B2 | 9/2003 | Loo et al. |
| 6,639,783 B1 | 10/2003 | Shamouilian et al. |
| 6,693,790 B2 | 2/2004 | Matsuki et al. |
| 6,721,162 B2 | 4/2004 | Weldon et al. |
| 6,723,202 B2 | 4/2004 | Nagaiwa et al. |
| 6,754,062 B2 | 6/2004 | Logan et al. |
| 6,839,217 B1 | 1/2005 | Larsen |
| 6,847,014 B1 | 1/2005 | Benjamin et al. |
| 6,922,324 B1 | 7/2005 | Horwitz |
| 6,998,065 B1 | 2/2006 | Hasegawa et al. |
| 7,052,553 B1 | 5/2006 | Shih et al. |
| 7,196,295 B2 | 3/2007 | Fennewald et al. |
| 7,431,788 B2 | 10/2008 | Ricci et al. |
| 8,546,732 B2 | 10/2013 | Singh |
| 8,624,168 B2 | 1/2014 | Gaff et al. |
| 8,791,392 B2 | 7/2014 | Singh |
| 8,952,297 B2 | 2/2015 | He et al. |
| 9,019,684 B2 | 4/2015 | Kuribayashi |
| 10,340,171 B2 | 7/2019 | Pape |
| 2001/0009497 A1 | 7/2001 | Takahasi et al. |
| 2001/0019741 A1 | 9/2001 | Inaba et al. |
| 2002/0036881 A1 | 3/2002 | Shamouilian et al. |
| 2002/0050246 A1 | 5/2002 | Parkhe |
| 2002/0073922 A1 | 6/2002 | Frankel et al. |
| 2002/0075624 A1 | 6/2002 | Wang et al. |
| 2002/0129901 A1 | 9/2002 | Fujikawa et al. |
| 2003/0051665 A1 | 3/2003 | Zhao et al. |
| 2003/0168439 A1 | 9/2003 | Kanno et al. |
| 2003/0186545 A1 | 10/2003 | Kamp et al. |
| 2003/0211757 A1 | 11/2003 | Gondhalekar et al. |
| 2004/0045813 A1 | 3/2004 | Kanno et al. |
| 2004/0060661 A1 | 4/2004 | Nishimoto et al. |
| 2004/0134618 A1 | 7/2004 | Endoh et al. |
| 2004/0231798 A1 | 11/2004 | Gondhalekar et al. |
| 2005/0016986 A1 | 1/2005 | Ito |
| 2005/0042881 A1 * | 2/2005 | Nishimoto .......... H01L 21/6833 361/234 |
| 2005/0079729 A1 | 4/2005 | Jang |
| 2005/0145617 A1 | 7/2005 | McMillin et al. |
| 2005/0173404 A1 | 8/2005 | Benjamin et al. |
| 2005/0211385 A1 | 9/2005 | Benjamin et al. |
| 2005/0252903 A1 | 11/2005 | Maki et al. |
| 2005/0253341 A1 * | 11/2005 | Shojima ............... C09K 3/1009 277/584 |
| 2006/0002053 A1 | 1/2006 | Brown et al. |
| 2006/0096972 A1 | 5/2006 | Nakamura |
| 2006/0273277 A1 | 12/2006 | Heller et al. |
| 2006/0279899 A1 * | 12/2006 | Aihara ................ H01L 21/6831 361/234 |
| 2007/0000918 A1 | 1/2007 | Steinhauser et al. |
| 2007/0076346 A1 | 4/2007 | Dhindsa et al. |
| 2007/0098978 A1 | 5/2007 | Tanaka et al. |
| 2007/0131350 A1 * | 6/2007 | Ricci ................ H01L 21/76251 156/86 |
| 2007/0144442 A1 * | 6/2007 | Migita ............... H01L 21/68757 118/728 |
| 2007/0267145 A1 | 11/2007 | Kitada et al. |
| 2008/0017632 A1 | 1/2008 | Maki et al. |
| 2008/0037194 A1 | 2/2008 | Kamitani et al. |
| 2008/0038162 A1 | 2/2008 | Koshiishi et al. |
| 2008/0041312 A1 | 2/2008 | Matsuyama et al. |
| 2008/0089001 A1 | 4/2008 | Parkhe et al. |
| 2009/0034148 A1 | 2/2009 | Lubomirsky et al. |
| 2009/0101284 A1 | 4/2009 | Higuma et al. |
| 2009/0159588 A1 | 6/2009 | Morioka et al. |
| 2009/0174983 A1 | 7/2009 | Dhindsa et al. |
| 2009/0235866 A1 | 9/2009 | Kataigi et al. |
| 2009/0283976 A1 | 11/2009 | Kaneko et al. |
| 2009/0290145 A1 * | 11/2009 | Howard ............ H01J 37/32972 356/72 |
| 2010/0003824 A1 | 1/2010 | Kadkhodayan et al. |
| 2010/0027188 A1 * | 2/2010 | Liu ..................... H01L 21/6833 361/234 |
| 2010/0039747 A1 | 2/2010 | Sansoni et al. |
| 2010/0078129 A1 | 4/2010 | Himori et al. |
| 2010/0109263 A1 | 5/2010 | Jun et al. |
| 2010/0159712 A1 | 6/2010 | Steger |
| 2010/0163188 A1 | 7/2010 | Tanaka et al. |
| 2010/0163546 A1 | 7/2010 | Nanno et al. |
| 2010/0244350 A1 | 9/2010 | Fujisato et al. |

(56) References Cited

U.S. PATENT DOCUMENTS

| | | |
|---|---|---|
| 2010/0319855 A1 | 12/2010 | Lee et al. |
| 2011/0157760 A1 | 6/2011 | Willwerth et al. |
| 2012/0248715 A1 | 10/2012 | Kondo et al. |
| 2013/0001213 A1 | 1/2013 | Lee et al. |
| 2013/0021717 A1 | 1/2013 | Singh |
| 2013/0027838 A1 | 1/2013 | Hori et al. |
| 2013/0114181 A1 | 5/2013 | Drewery |
| 2013/0128397 A1 | 5/2013 | Sato |
| 2013/0161305 A1 | 6/2013 | Ptasienski et al. |
| 2013/0228565 A1 | 9/2013 | Kondo et al. |
| 2013/0229746 A1 | 9/2013 | Aikawa et al. |
| 2013/0235507 A1 | 9/2013 | Aikawa et al. |
| 2013/0264015 A1 | 10/2013 | Fang et al. |
| 2013/0277357 A1 | 10/2013 | Tatsumi et al. |
| 2013/0340942 A1 | 12/2013 | Schaefer et al. |
| 2014/0063681 A1 | 3/2014 | Anada et al. |
| 2014/0083461 A1* | 3/2014 | Shih .................. H01L 21/6833 134/105 |
| 2014/0096909 A1 | 4/2014 | Singh et al. |
| 2014/0356985 A1 | 12/2014 | Ricci et al. |
| 2014/0376148 A1 | 12/2014 | Sasaki et al. |
| 2015/0024517 A1 | 1/2015 | Shriner |
| 2015/0049410 A1 | 2/2015 | Ono |
| 2015/0187614 A1 | 7/2015 | Gaff et al. |
| 2015/0228513 A1 | 8/2015 | Parkhe et al. |
| 2016/0013026 A1 | 1/2016 | Matsuura et al. |
| 2016/0111314 A1* | 4/2016 | Kimball ............ H01J 37/32715 438/758 |
| 2016/0111315 A1* | 4/2016 | Parkhe ............... H01L 21/6833 361/234 |
| 2016/0135252 A1 | 5/2016 | Matyushkin et al. |
| 2016/0276196 A1* | 9/2016 | Parkhe .............. H01L 21/67103 |
| 2016/0276198 A1 | 9/2016 | Anada et al. |
| 2017/0069519 A1 | 3/2017 | Shiraiwa |
| 2017/0098564 A1* | 4/2017 | Pape ................. H01L 21/67346 |
| 2018/0012785 A1 | 1/2018 | Matyushkin et al. |
| 2018/0240688 A1 | 8/2018 | Hao et al. |

FOREIGN PATENT DOCUMENTS

| | | |
|---|---|---|
| JP | 2000-130414 A | 5/2000 |
| JP | 2002-110774 A | 4/2002 |
| JP | 2002299425 A | 10/2002 |
| JP | 2003-13340 A | 1/2003 |
| JP | 2003-133401 A | 5/2003 |
| JP | 2004-235623 A | 8/2004 |
| JP | 2006-86230 A | 3/2006 |
| JP | 2007-194616 A | 8/2007 |
| JP | 2008-42117 A | 2/2008 |
| JP | 2008-042139 A | 2/2008 |
| JP | 2008-243973 A | 10/2008 |
| JP | 2009-503816 A | 1/2009 |
| JP | 2009182092 A | 8/2009 |
| JP | 2009290087 A | 12/2009 |
| JP | 2010-129845 A | 6/2010 |
| JP | 2010153490 A | 7/2010 |
| JP | 2011-515015 A | 5/2011 |
| JP | 2014-41903 A | 3/2014 |
| JP | 2014-522103 A | 8/2014 |
| JP | 2015-515760 A | 5/2015 |
| JP | 2016-012733 A | 1/2016 |
| JP | 2017-50468 A | 3/2017 |
| KR | 10-0505035 B1 | 7/2005 |
| KR | 20140044129 A | 4/2014 |
| KR | 10-1413764 B1 | 7/2014 |
| KR | 20160107415 A | 9/2016 |
| KR | 20170028248 A | 3/2017 |
| TW | 201351532 A | 12/2013 |
| TW | 201545255 A | 12/2015 |
| WO | WO-2004084298 A1 | 9/2004 |
| WO | WO-2012090782 A1 | 7/2012 |
| WO | WO-2013039718 A1 | 3/2013 |
| WO | WO-2015009447 A1 | 1/2015 |

OTHER PUBLICATIONS

Translation of First Office Action dated Sep. 13, 2021 corresponding to Korean Patent Application 10-2017-0053480, 7 pages.
Notification of Transmittal of International Search Report and the Written Opinion of the International Searching Authority dated Feb. 14, 2018, 15 pages.
Notification of Transmittal of International Search Report and the Written Opinion of the International Searching Authority corresponding to International Application No. PCT/US2018/018916 dated May 23, 2018, 12 pages.
Notification of Transmittal of International Search Report and the Written Opinion of the International Searching Authority dated Jun. 20, 2018 corresponding to International Application No. PCT/US2018/021333, 13 pages.
Translation of First Office Action dated Jan. 6, 2021 corresponding to Taiwanese Patent Application 106115919, 5 pages.
Translation of First Office Action dated Jan. 10, 2022 corresponding to Taiwanese Patent Application 110135245, 12 pages.
Translation of Notice of Allowance dated Aug. 4, 2022 corresponding to Taiwanese Patent Application 110135245, 2 pages.
Translation of Notice of Allowance dated Mar. 23, 2022 corresponding to Japanese Patent Application 2017-094326, 10 pages.
Translation of Notice of Allowance dated Apr. 25, 2022 corresponding to Korean Patent Application 10-2017-0053480, 1 page.
Translation of First Office Action dated Feb. 1, 2021 corresponding to Taiwanese Patent Application 106122460, 14 pages.
Translation of Notice of Allowance dated Sep. 14, 2021 corresponding to Taiwanese Patent Application 106122460, 2 pages.
First Office Action dated Sep. 7, 2021 corresponding to Japanese Patent Application 2017-131641, 5 pages.
Notice of Allowance dated Mar. 23, 2022 corresponding to Japanese Patent Application 2017-131641, 10 pages.
Translation of First Office Action dated Nov. 9, 2021 corresponding to Korean Patent Application 10-2017-0083390, 10 pages.
Translation of Notice of Allowance dated Jul. 22, 2022 corresponding to Korean Patent Application 10-2017-0083390, 1 pages.
Translation of First Office Action dated Nov. 10, 2021 corresponding to Japanese Patent Application 2019-536122, 6 pages.
Translation of First Office Action dated Dec. 30, 2021 corresponding to Korean Patent Application 10-2019-7022354, 15 pages.
Translation of Notice of Allowance dated Jul. 22, 2022 corresponding to Korean Patent Application 10-2019-7022354, 1 pages.
Translation of First Office Action dated Apr. 13, 2021 corresponding to Taiwanese Patent Application 107100004, 20 pages.
Translation of Second Office Action dated Nov. 17, 2021 corresponding to Taiwanese Patent Application 107100004, 7 pages.
Translation of Notice of Allowance dated Jul. 14, 2022 corresponding to Taiwanese Patent Application 107100004, 2 pages.
Translation of First Office Action dated Jul. 26, 2022 corresponding to Korean Patent Application 10-2019-7027308, 13 pages.
Translation of First Office Action dated Jul. 15, 2021 corresponding to Taiwanese Patent Application 107105728, 14 pages.
Translation of Notice of Allowance dated May 6, 2022 corresponding to Taiwanese Patent Application 107105728, 2 pages.
First Office Action dated Aug. 26, 2022 corresponding to Korean Patent Application No. 10-2019-7029488, 5 pages.
Translation of First Office Action dated Sep. 11, 2021 corresponding to Taiwanese Patent Application 107107350, 17 pages.
Translation of Notice of Allowance dated May 17, 2022 corresponding to Taiwanese Patent Application 107107350, 2 pages.
Decision to Grant a Patent from corresponding Japanese Application No. 2022-069898, dated Nov. 1, 2023.

* cited by examiner

PERMANENT SECONDARY EROSION CONTAINMENT FOR ELECTROSTATIC CHUCK BONDS

CROSS-REFERENCE TO RELATED APPLICATIONS

The present disclosure is a continuation of U.S. patent application Ser. No. 15/157,959, filed on May 18, 2016 (now U.S. Pat. No. 10,340,171). The entire disclosure of the application referenced above is incorporated herein by reference.

FIELD

The present disclosure relates to substrate processing systems, and more particularly to systems and methods for protecting a bond layer of a substrate support.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

A substrate support such as an ESC may include a ceramic layer arranged to support a wafer. For example, the wafer may be clamped to the ceramic layer during processing. The ceramic layer may be bonded to a baseplate of the substrate support using a bonding material. The baseplate may comprise a cooled aluminum baseplate. For example, the bonding material, or bond, may include silicone with a filler, an epoxy matrix material, etc. The filler may comprise a metal oxide particle. The chemical composition of the bond and the filler may be selected to prevent inadvertent contamination of the process chamber. Further, an overall thermal transfer coefficient of the bond is selected to optimize thermal transport from the ceramic layer to the baseplate via the bond and filler. The overall thermal transfer coefficient may correspond to, for example, thermal conductivity k, heat transfer coefficient (W/m-K), bond thickness, etc. For example, content, volume, etc. of the bond may be adjusted to optimize thermal transport.

SUMMARY

A substrate support in a substrate processing system includes a baseplate, a ceramic layer, and a bond layer. The ceramic layer is arranged on the baseplate to support a substrate. The bond layer is arranged between the ceramic layer and the baseplate. A seal is arranged between the ceramic layer and the baseplate around an outer perimeter of the bond layer. The seal includes an inner layer formed adjacent to the bond layer and an outer layer formed adjacent to the inner layer such that the inner layer is between the outer layer and the bond layer. The inner layer comprises a first material and the outer layer comprises a second material.

A method includes arranging a ceramic layer on baseplate of a substrate support in a substrate processing system, the ceramic layer arranged to support a substrate, arranging a bond layer between the ceramic layer and the baseplate, and arranging a seal between the ceramic layer and the baseplate around an outer perimeter of the bond layer. The seal includes an inner layer formed adjacent to the bond layer and an outer layer formed adjacent to the inner layer such that the inner layer is between the outer layer and the bond layer. The inner layer comprises a first material and the outer layer comprises a second material.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
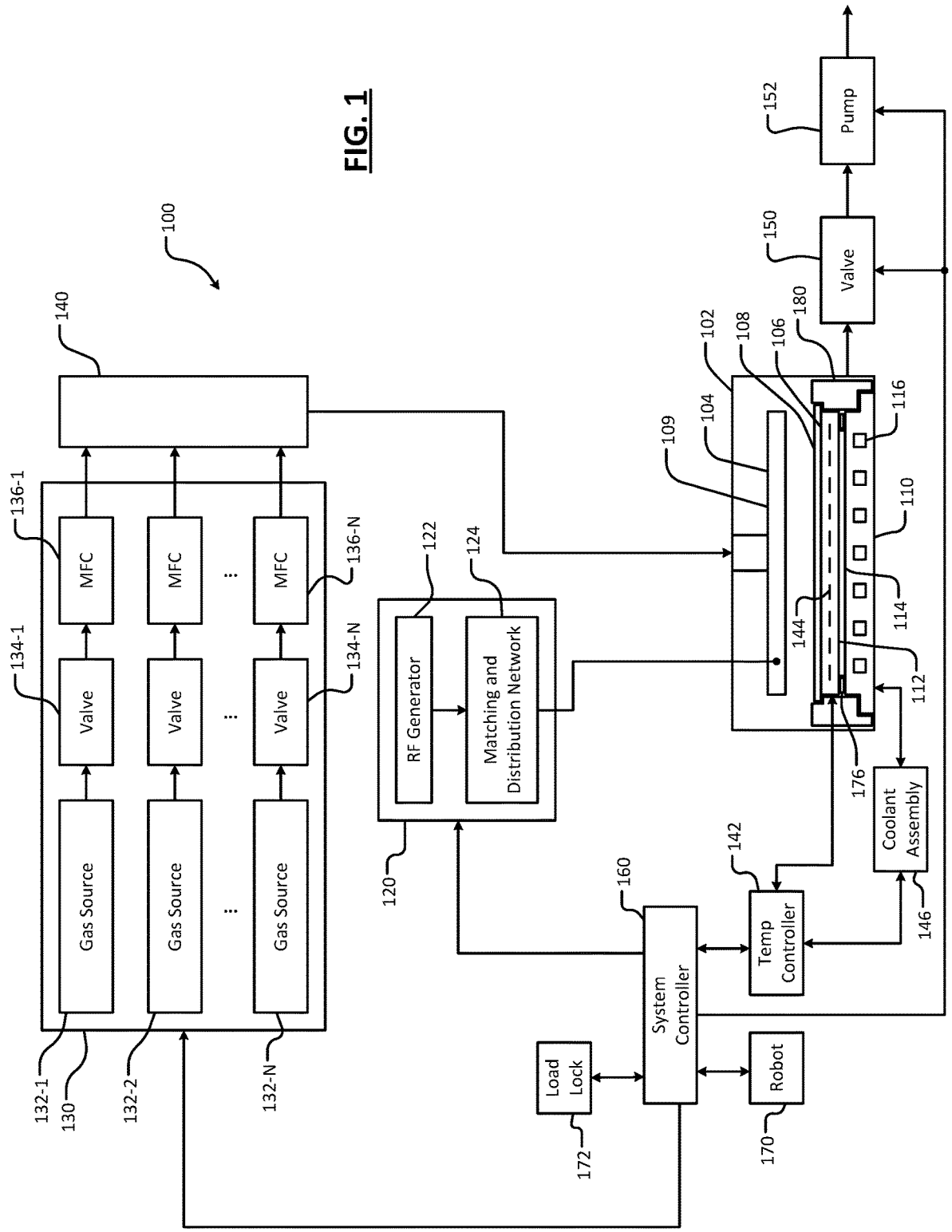
FIG. 1 is a functional block diagram of an example substrate processing system including a substrate support according to the principles of the present disclosure.

A substrate support such as an electrostatic chuck (ESC) in a processing chamber of a substrate processing system may include a ceramic layer bonded to a conductive baseplate. The ceramic layer may be bonded to the baseplate using a bond including a bonding material, filler, etc. The bond may be exposed to plasma, including radicals, ions, reactive species, etc., within the chamber at an outer edge of the substrate support. Exposure to the plasma may cause portions of the bond to erode (i.e., wear) over time. Such wear may allow chemical species and other substances (e.g., particles of the bond, the filler, etc.) to migrate into a reaction volume of the processing chamber, which may adversely affect substrate processing.

Various substrate supports may implement one or more techniques to select a bond to minimize wear, to protect the bond, etc. to prevent wear and possible contamination of the processing chamber. In a first example, a substrate support may only include a bond for attaching the ceramic layer to the baseplate without implementing any additional techniques for preventing wear of the bond, which allows direct and immediate erosion of the bond during substrate processing.

In a second example, the substrate support may include an ultra-pure, high modulus, epoxy layer arranged to protect the bond and prevent exposure of the bond to plasma. Typically, such an epoxy layer is not field-replaceable. However, the epoxy layer is relatively inflexible, and temperature changes in the substrate support may cause the bond to crack and/or delaminate over time and is subject to high erosion rates in oxygen and fluorine plasma chemistries. Accordingly, cracks between the ceramic layer and the epoxy layer and/or between the baseplate and the epoxy layer may allow erosion of the bond behind the epoxy layer.

In a third example, the substrate support may include a perfluoroelastomer seal (e.g., an "e-seal") arranged to protect the bond. However, e-seals wear relatively quickly, are difficult and expensive to replace, and still do not provide a perfect seal against plasma. Accordingly, e-seals do not prevent gradual wear of the bond behind the e-seal.

In a fourth example, the substrate support may include a Teflon O-ring having a core comprising a low modulus material, such as, for example only, a perfluoroelastomer core, a silicone core, etc. Teflon provides improved wear resistance with respect to the e-seal in the third example, but the seal provided by the Teflon O-ring is less effective. For example, at lower temperatures, compression of the Teflon O-ring decreases due to material shrinkage. Accordingly, wear of the bond behind the Teflon O-ring still occurs.

In a fifth example, the substrate support (in this example, a dielectric ESC) may include a pure, low modulus, silicone layer arranged to protect the bond. The silicone layer is flexible (e.g., relative to the epoxy layer of the second example), and therefore does not delaminate with temperature cycling. However, the silicone layer typically erodes quickly when directly exposed to certain plasma chemistries and is not field-replaceable.

Accordingly, various substrate supports as described above may implement a protective seal around the bond that maximizes resistance to wear while providing a less-effective seal (e.g., using only a Teflon O-ring), a protective seal that maximizes effectiveness of the seal while providing reduced resistance to wear (e.g., using a pure silicone seal), a protective seal that compromises resistance to wear to improve seal effectiveness, or a protective seal that compromises seal effectiveness to improve resistance to wear.

Systems and methods according to the principles of the present disclosure implement a protective seal including two or more protective layers having different characteristics to protect the bond between the ceramic layer and the baseplate. For example, the protective seal may include an outer layer and an inner layer. The outer layer and the inner layer may each be annular. The outer layer corresponds to a removable, replaceable O-ring or seal. The outer layer has a greater resistance to plasma than the inner layer, but may not provide a perfect hermetic seal between the process chamber and the bond. Conversely, the inner layer corresponds to a permanent or semi-permanent, flexible layer. For example, the inner layer includes an unfilled polymer, such as pure silicone adhesive. Accordingly, the second layer will have relatively little exposure to reactive species in the process chamber due to the outer layer arranged between the process chamber and the inner layer but provides a hermetic seal between the process chamber and the bond. Accordingly, the outer layer protects the inner layer from exposure to the plasma in the process chamber and the inner layer seals the bond from the process chamber. The respective materials of the inner layer and the outer layer may be the same or different.

In an example, the ceramic layer is bonded to the baseplate with a bond material such as a polymer with filler. An inner layer comprised of, for example, a high purity, flexible, polymeric material such as silicone, epoxy, etc. is applied around the bond and cured in situ. In some examples, the inner layer may be applied either with or without fully curing the bond material. A thickness of the inner layer may be significantly less than a radius of the substrate support. For example, the thickness of the inner layer may be approximately 1 mm for a substrate support having a radius of 150-175 mm. Accordingly, the inner layer has a relatively low k value and will not significantly impact thermal transport through the substrate support. For example, for silicone, the k value may be approximately 0.2 W/m–K. The thickness and shape of the inner layer can be controlled via applicator and/or post-cure mechanical processing to provide a suitable interface for contact with the outer layer.

In some examples, the outer layer comprises a Teflon O-ring optionally having a perfluoroelastomer core (or a core comprised of another suitable low modulus material). The outer layer is compressed between the ceramic layer and the baseplate. For example, the outer layer may be installed subsequent to the bond and the inner layer being fully cured and processed.

Accordingly, the protective seal including the inner layer and the outer layer causes minimal additional impact on thermal uniformity while allowing a variety of bond material and filler chemistries. The outer layer may be replaced and/or refurbished ex situ, and may have a lifespan of 10,000 or more bias RF hours. Conversely, the inner layer has relatively little exposure to plasma in the process chamber and will not experience significant wear during several replacement cycles of the outer layer while maximizing the effectiveness of the seal between the bond and the process chamber. Accordingly, the risk of allowing contamination of the process chamber with materials in the bond (e.g., a boron nitride filler in a silicone bond) is greatly reduced.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such a substrate processing system that generates plasma in-situ, that implements remote plasma generation and delivery (e.g., using a microwave tube), etc.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. In some examples, the baseplate 110 may support a heating plate 112 (e.g., a ceramic layer), which may correspond to a ceramic multi-zone heating plate. A thermal resistance layer 114 (e.g., a bond layer) may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the heating plate 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Each of the heating elements 144 according to the principles of the present disclosure includes a first material having a positive TCR and a second material having a negative TCR as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

The substrate support 106 according to the principles of the present disclosure includes a protective seal 176 having an outer layer and an inner layer (shown and described below in more detail). The protective seal 176 may be arranged between the bond layer 114 and an edge ring 180 of the substrate support 106.

Figure 2B:
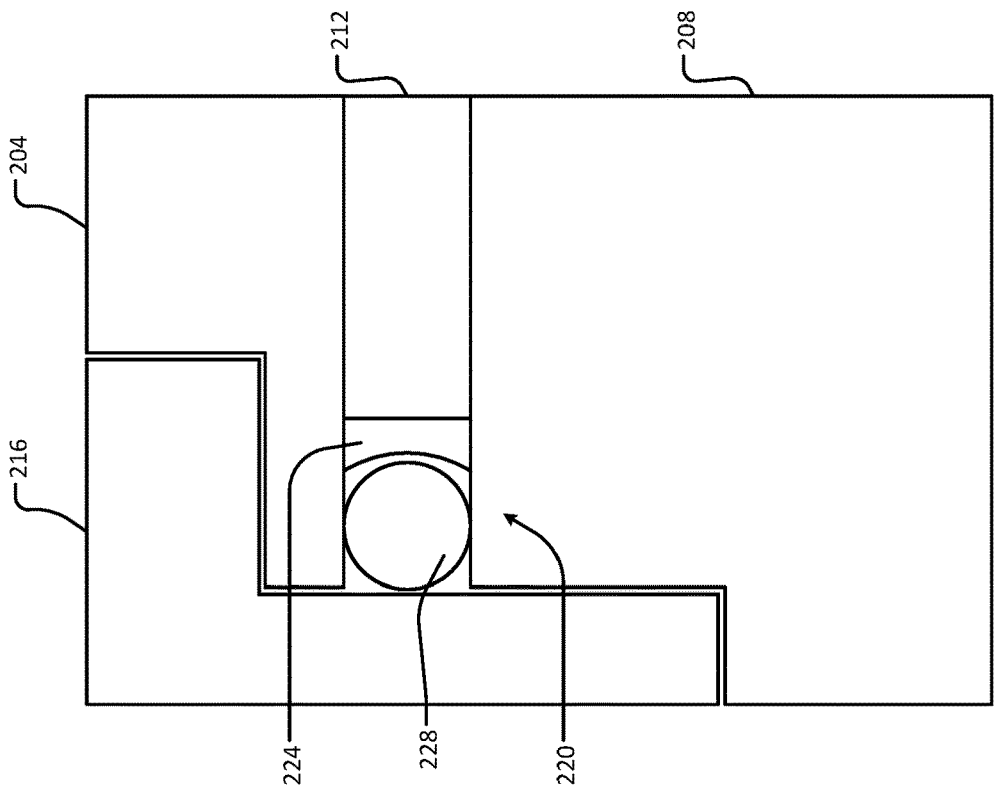
FIG. 2B is another example protective seal for a substrate support including an inner layer and an outer layer according to the principles of the present disclosure.
Figure 2A:
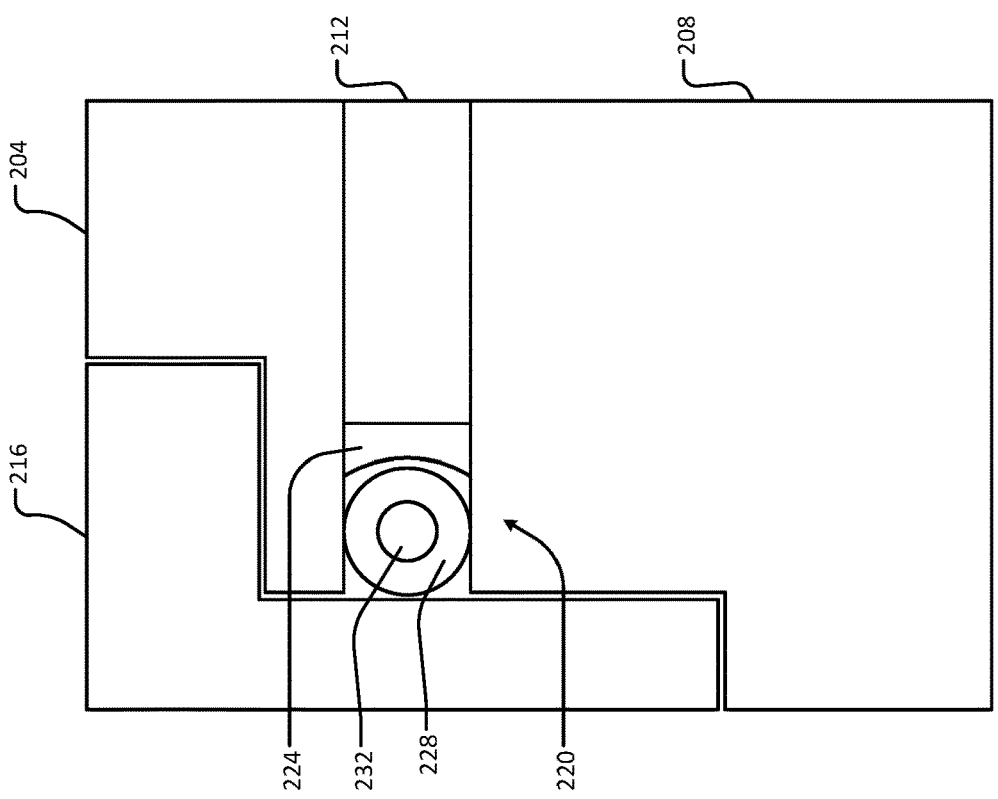
FIG. 2A is an example protective seal for a substrate support including an inner layer and an outer layer according to the principles of the present disclosure.

Referring now to FIGS. 2A and 2B, a portion of an example substrate support 200 is shown. The substrate support 200 includes a ceramic layer 204 arranged on a baseplate 208. In some examples, the ceramic layer 204 may correspond to a ceramic plate configured as a heating layer (e.g., a ceramic plate including embedded heating elements). A bond layer 212 is provided between the ceramic layer 204 and the baseplate 208. An edge ring 216 may be arranged around an outer edge of the ceramic layer 204 and the baseplate 208.

The substrate support 200 includes a protective seal 220 provided around a perimeter of the bond layer 212 between the ceramic layer 204 and the baseplate 208. The seal 220 includes an inner layer 224 and an outer layer 228. The inner layer 224 comprises a flexible, permanent or semi-permanent (i.e., not easily removable) polymeric material epoxy, etc. For example only, the inner layer 224 may comprise an unfilled polymer such as pure silicone adhesive. For example, the inner layer 224 is applied around the perimeter of the bond layer 212 and cured. In one example, the inner layer 224 is cured in-situ (i.e., within the process chamber). The inner layer 224 is bonded to each of the ceramic layer 204 and the baseplate 208 to form a complete seal between the bond layer 212 and the process chamber. As shown, the inner layer 224 is arranged directly adjacent to and in contact with the bond layer 212 and therefore may be adhered to the bond layer 212. In other examples, the inner layer 224 may be spaced apart from the bond layer 212 while still providing a perfect seal between the bond layer 212 and the process chamber.

The outer layer 228 comprises a removable, replaceable O-ring or seal. In some examples, the outer layer 228 is configured to be easily removed and replaced in-situ after first removing the edge ring 216 to provide access to the outer layer 228. In other examples, replacing the outer layer 228 may be facilitated by removing the substrate support 200 from the processing chamber. The outer layer 228 comprises a material that is highly plasma resistant, such as Teflon, but is also elastic and resistant to compression set. The material of the outer layer 228 may be selected to have erosion resistance to a variety of plasma chemistries, and/or may be selected to have erosion resistance to a specific plasma chemistry. Other example materials include, but are not limited to, pure silicones, pure fluoroelastomers (e.g., fluorinated cross-linked alkalines), fluorinated low-modulus or flexible epoxies, other flexible epoxies, fluorinated silicones, etc.

The outer layer 228 is compressed between the ceramic layer 204 and the baseplate 208. The outer layer 228 is installed around an outer perimeter of the inner layer 224 subsequent to the inner layer being fully applied and cured to seal the process chamber from the inner layer 224. As shown in FIG. 2A, the outer layer 228 includes a core 232 comprising a different material, such as a perfluoroelastomer core. For example, the core 232 comprises a material having greater flexibility than the O-ring. For example only, the core 232 has a lower modulus than the outer layer 228. Accordingly, the outer layer 228 provides resistance to plasma etch while the core 232 provides elastic compressibility. Although the outer layer 228 is shown to have a circular cross-section, the outer layer 228 can have any suitable shape, including, but not limited to, x-ring, a square cross-section, etc.

As shown in FIG. 2B, the outer layer 228 does not include the core 232. In some examples, an outer surface of the inner layer 224 is concave to provide an interface for the outer layer 228. For example, the outer surface of the inner layer 224 may be concave to allow for compression of the outer layer 228 and to reduce the overall area between the bond layer 212 and the outer edge of the substrate support 200 occupied by the seal 220. Although a gap is shown between the inner layer 224 and the outer layer 228, in some examples the outer layer 228 may be directly adjacent to and in contact with the inner layer 224 (provided that the outer layer 228 comprises a material that will not adhere to the inner layer 224 and inhibit removal and replacement of the outer layer 228). In examples, the inner layer 224 may be overfilled, overfilled and machined, spun on, etc. to achieve a desired profile (e.g., concave, convex, flat, etc.) of the outer surface of the inner layer 224.

Accordingly, the inner layer 224 will have relatively little exposure to reactive species in the process chamber due to the outer layer 228 arranged between the process chamber and the inner layer 224 but provides a hermetic seal between the process chamber and the bond layer 212. Accordingly, the outer layer 228 protects the inner layer 224 from exposure to the process chamber and the inner layer 224 seals the bond layer 212 from the process chamber.

Figure 3:
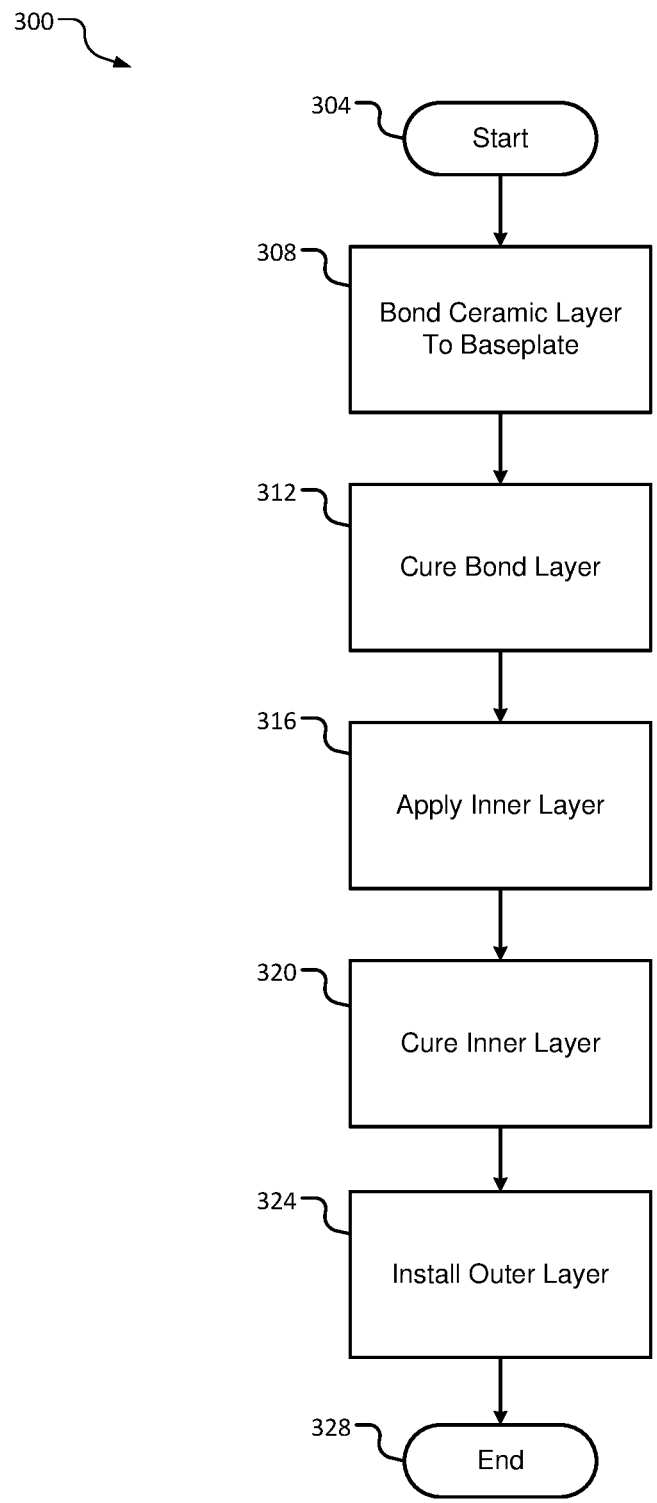
FIG. 3 is an example method for providing a protective seal according to the principles of the present disclosure.

Referring now to FIG. 3, an example method 300 according to the principles of the present disclosure begins at 304. At 308, a ceramic layer is bonded to a baseplate of a substrate support using a bond layer. The bond layer is optionally cured at 312. At 316, an inner layer (e.g., a pure silicone seal) of a protective seal is applied between the ceramic layer and the baseplate around an outer perimeter of the bond layer. The inner layer is optionally cured at 320. At 324, an outer layer (e.g., a Teflon O-ring) of the protective seal is installed around the inner layer. The method 300 ends at 328.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing chamber, the substrate support comprising:
    a baseplate;
    a ceramic layer bonded to the baseplate;
    a seal provided in an outer perimeter of an interface between the ceramic layer and the baseplate, wherein the seal is arranged to seal the interface from the substrate processing chamber, and wherein the seal includes
        an adhesive arranged in the outer perimeter of the interface between the ceramic layer and the baseplate, wherein the adhesive comprises a first material, and
        a ring arranged in the outer perimeter of the interface between the ceramic layer and the baseplate, wherein the ring is removable and comprises a second material having a greater resistance to plasma erosion than the first material; and
    a bond layer provided between the ceramic layer and the baseplate, wherein
        the adhesive is formed as an inner layer around an outer perimeter of the bond layer,
        an inner surface of the adhesive is adhered to the outer perimeter of the bond layer,
        an outer surface of the adhesive is concave,
        the ring is arranged as an outer layer radially outside of the inner layer such that the inner layer is located between the outer layer and the bond layer, and
        the ring comprises an O-ring having an outer surface extending into the concave outer surface of the adhesive.

2. The substrate support of claim 1, wherein the first material comprises at least one of a polymeric material, an epoxy, an unfilled polymer, and a pure silicone adhesive.

3. The substrate support of claim 2, wherein the second material comprises at least one of Teflon, silicone, a fluoroelastomer, and an epoxy.

4. The substrate support of claim 1, wherein the inner layer extends from an upper surface of the baseplate to a lower surface of the ceramic layer.

5. The substrate support of claim 1, wherein the inner layer is cured.

6. The substrate support of claim 1, wherein the inner layer is bonded to at least one of the ceramic layer and the bond layer.

7. The substrate support of claim 1, wherein the inner layer is bonded to the bond layer.

8. The substrate support of claim 1, wherein the outer layer includes a core comprising a third material different from the second material.

9. The substrate support of claim 8, wherein the third material has a greater flexibility than the second material.

10. The substrate support of claim 8, wherein the third material has a lower modulus than the second material.

11. The substrate support of claim 8, wherein the third material is a perfluoroelastomer polymer.

12. A seal arrangement for a bond layer of a substrate support in a substrate processing chamber, the seal arrangement comprising:
    an inner layer formed around an outer perimeter of the bond layer between a ceramic layer and a baseplate of the substrate support, wherein the inner layer seals the bond layer from the substrate processing chamber and comprises a first material, the inner layer is an adhesive having an inner surface adhered to the outer perimeter of the bond layer, and an outer surface of the adhesive is concave; and
    an outer layer provided radially outside of the inner layer such that the inner layer is located between the outer layer and the bond layer, wherein the outer layer is removable and comprises a second material having a greater resistance to plasma erosion than the first material, wherein the outer layer is spaced apart from the inner layer the outer layer comprises an O-ring having an outer surface extending into the concave outer surface of the adhesive.

13. The seal arrangement of claim 12, wherein the first material comprises at least one of a polymeric material, an epoxy, an unfilled polymer, and a pure silicone adhesive and the second material comprises at least one of Teflon, silicone, a fluoroelastomer, and an epoxy.

14. The seal arrangement of claim 12, the inner layer is cured and bonded to at least one of the ceramic layer and the bond layer.

* * * * *